United States Patent [19]
Ishibashi

[11] Patent Number: 6,133,138
[45] Date of Patent: Oct. 17, 2000

[54] METHOD OF MANUFACTURING SEMICONDUCTOR DEVICE HAVING MULTILAYER INTERCONNECTION STRUCTURE

[75] Inventor: Takeo Ishibashi, Hyogo, Japan

[73] Assignee: Mitsubishi Denki Kabushiki Kaisha, Tokyo, Japan

[21] Appl. No.: 09/009,177

[22] Filed: Jan. 20, 1998

[30] Foreign Application Priority Data

Jul. 17, 1997 [JP] Japan ................................ 9-192263

[51] Int. Cl.⁷ ................................................. H01L 21/4763
[52] U.S. Cl. .......................... 438/623; 438/622; 438/637; 438/671
[58] Field of Search ....................... 438/622, 623, 438/624, FOR 355, 634, 636, 637, 669, 736, 717, 671; 430/312

[56] References Cited

U.S. PATENT DOCUMENTS

| | | | |
|---|---|---|---|
| 4,201,800 | 5/1980 | Alcorn et al. ................................ | 430/5 |
| 4,520,041 | 5/1985 | Aoyama et al. ........................ | 438/672 |
| 4,541,892 | 9/1985 | Jeuch ..................................... | 438/671 |
| 4,624,864 | 11/1986 | Hartmann ................................ | 438/642 |
| 4,676,868 | 6/1987 | Riley et al. .............................. | 438/697 |
| 5,256,564 | 10/1993 | Narita ....................................... | 438/669 |
| 5,358,903 | 10/1994 | Kim ......................................... | 438/622 |
| 5,427,980 | 6/1995 | Kim ......................................... | 438/640 |
| 5,449,639 | 9/1995 | Wei et al. ................................ | 438/636 |
| 5,514,466 | 5/1996 | Yamada et al. ......................... | 428/328 |
| 5,753,418 | 5/1998 | Tsai et al. ................................ | 430/313 |
| 5,840,461 | 11/1998 | Haneda et al. ........................... | 430/133 |

FOREIGN PATENT DOCUMENTS

| | | |
|---|---|---|
| 4-348032 | 12/1992 | Japan . |
| 7-22507 | 1/1995 | Japan . |

*Primary Examiner*—Carl Whitehead, Jr.
*Assistant Examiner*—Jamie Davis
*Attorney, Agent, or Firm*—McDermott, Will & Emery

[57] ABSTRACT

A method of manufacturing a semiconductor device copes with miniaturization owing to reduction in an overlapping margin. According to this manufacturing method, a conductive layer forming an upper interconnection layer is formed in an opening provided for connection to a lower interconnection layer, and then an organic polymer film filling a concavity at the conductive layer located in the opening is formed. After forming a resist pattern on the organic polymer film, organic polymer film and conductive layer are etched. The overlapping margin is reduced owing to the fact the organic polymer film fills the concavity at the conductive layer.

10 Claims, 6 Drawing Sheets

METHOD OF MANUFACTURING SEMICONDUCTOR DEVICE HAVING MULTILAYER INTERCONNECTION STRUCTURE

BACKGROUND OF THE INVENTION

1. Field of the Invention

The present invention relates to a method of manufacturing a semiconductor device, and in particular to a method of manufacturing a semiconductor device having a multilayer interconnection structure.

2. Description of the Background Art

Figure 12A:
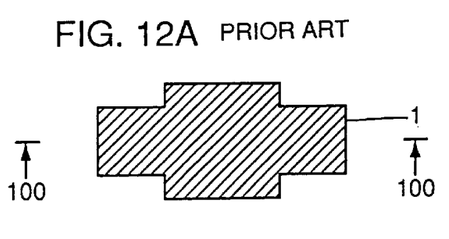
Figure 12B:
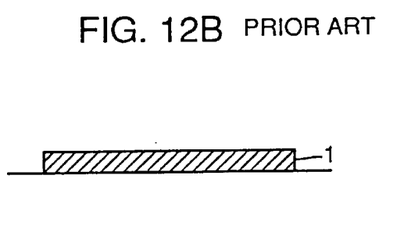
Figure 13A:
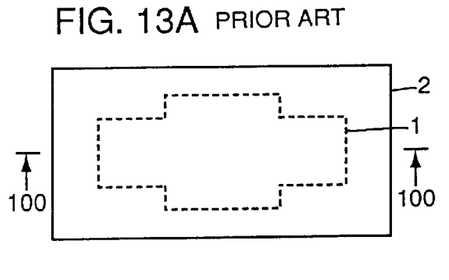
Figure 13B:
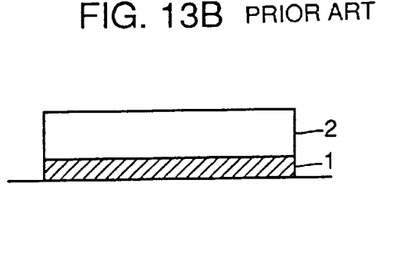

LSI semiconductor elements and liquid-crystal display panels have employed fine or miniaturized multilayer interconnection structures. FIGS. 12A, 13A, . . . 17A are plans showing layouts and particularly showing a first process of manufacturing a semiconductor device having a multilayer interconnection structure in the prior art. FIGS. 12B, 13B, . . . 17B are cross sections taken along line 100—100 in FIGS. 12A through 17A, respectively. Referring to FIGS. 12A and 12B through 17A and 17B, the first manufacturing process in the prior art will be described below.

As shown in FIGS. 12A and 12B, a sputtering method or the like is performed to form a lower interconnection layer 1 made of tungsten silicide.

Then, as shown in FIGS. 13A and 13B, a CVD method or the like is performed to form an interlayer insulating film 2 which covers lower interconnection layer 1 and is made of, e.g., a silicon oxide film.

Figure 14A:
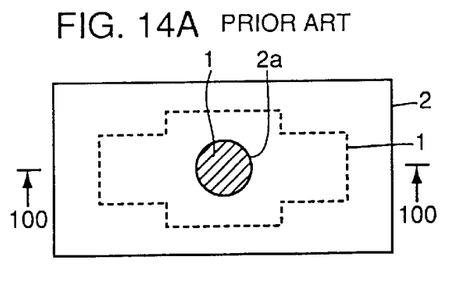
Figure 14B:
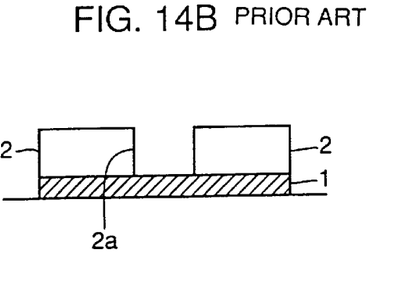

Then, as shown in FIGS. 14A and 14B, a hole pattern (i.e., opening) 2a reaching lower interconnection layer 1 is formed at a predetermined region in interlayer insulating film 2.

Figure 15A:
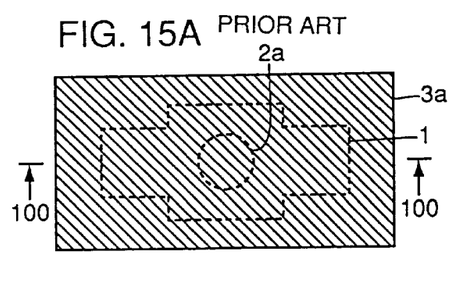
Figure 15B:
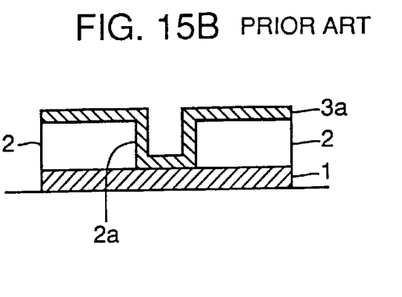

Then, as shown in FIGS. 15A and 15B, processing is performed to form a conductive layer 3a made of a tungsten silicide film, which extends over the side surface of opening 2a and the upper surface of interlayer insulating film 2, and is in contact with a portion of lower interconnection layer 1 in opening 2a. Conductive film 3a is formed, e.g., by a sputtering method.

Figure 16A:
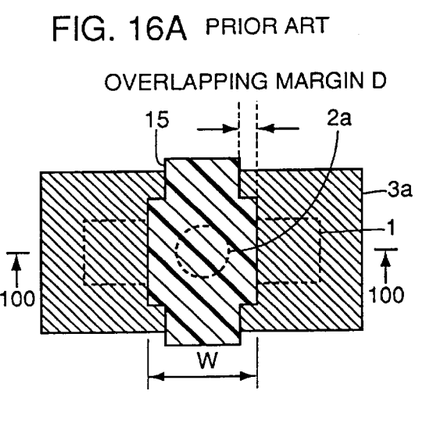
Figure 16B:
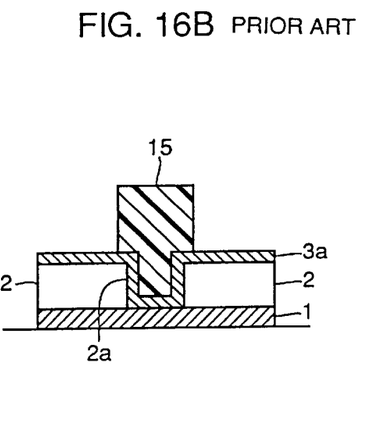

Then, as shown in FIGS. 16A and 16B, a resist pattern 15 is formed over a predetermined region of conductive layer 3a. A portion of resist pattern 15, which overlaps with lower interconnection layer 1, has a large width W which is determined taking an overlapping margin D into consideration.

Figure 17A:
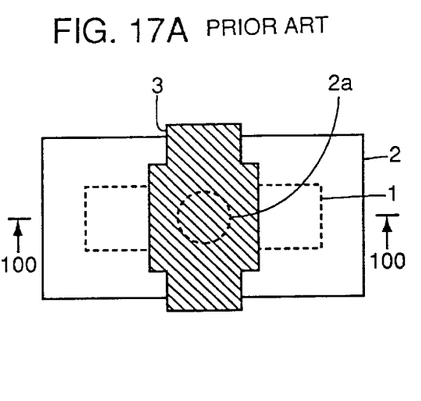
Figure 17B:
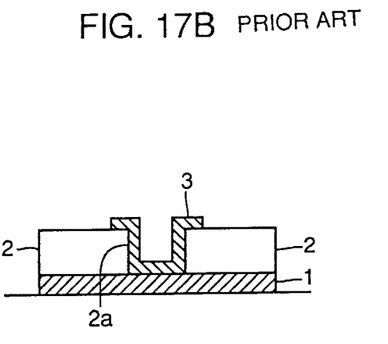

After this state, an anisotropic etching is effected on conductive layer 3a at the lower level masked with resist pattern 15, and then resist pattern 15 is removed, so that upper interconnection layer 3 is formed shown in FIGS. 17A and 17B.

Figure 18A:
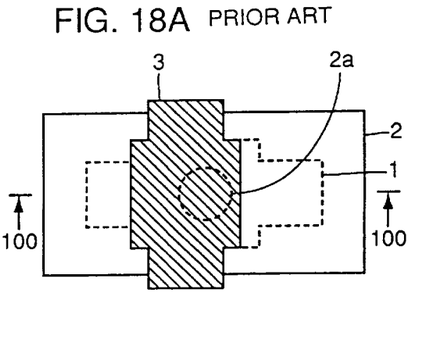
Figure 18B:
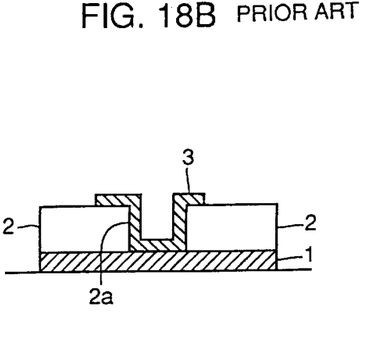

FIGS. 18A and 18B show upper interconnection layer 3 which is formed when resist pattern 15 shown in FIGS. 16A and 16B was shifted from the intended position. In resist pattern 15 shown in FIGS. 16A and 16B, the portion overlapping with lower interconnection layer 1 has the large width W which is determined taking the overlapping margin D into consideration. Therefore, even if resist pattern 15 was located at a shifted position during exposure, finally formed upper interconnection layer 3 is formed along the side surface of opening 2a as shown in FIGS. 18A and 18B, so that no disadvantage arises.

However, in accordance with recent increase in integration density of semiconductor devices, miniaturization of interconnection layers has been requested. Therefore, it is now required to reduce the width of upper interconnection layer 3 shown in FIGS. 17A and 17B.

Figure 19A:
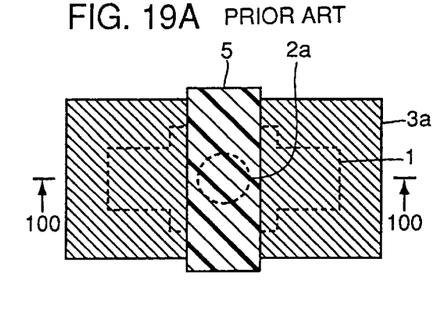
FIGS. 19A and 20A are plans showing layouts and particularly showing a second manufacturing process of a semiconductor device in the prior art.
Figure 19B:
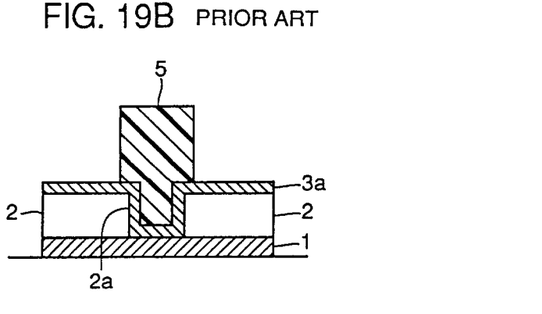
FIGS. 19B and 20B are cross sections taken along line 100—100 in FIGS. 19A and 20A, respectively.
Figure 20A:
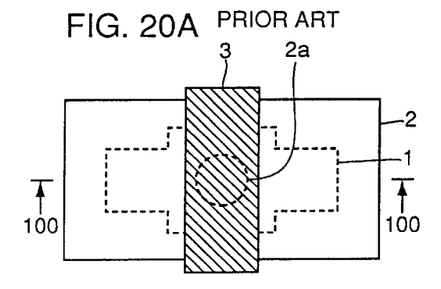
Figure 20B:
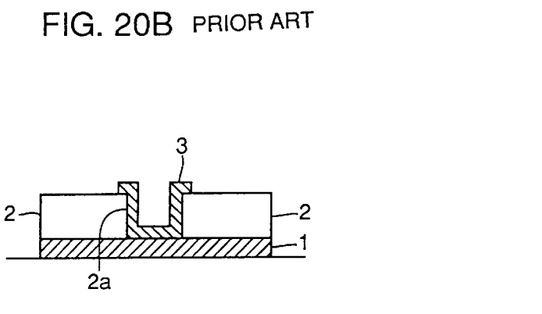

FIGS. 19A and 20A are plans showing layouts and particularly showing a second manufacturing process of a semiconductor device in the prior art for coping with the above request, and FIGS. 19B and 20B are corresponding cross sections. Referring to FIGS. 19A and 19B as well as FIGS. 20A and 20B, the second manufacturing process in the prior art will be described below. First, a process similar to the conventional first manufacturing process shown in FIGS. 12A and 12B through 15A and 15B is performed to form a structure similar to that shown in FIGS. 15A and 15B. Then, as shown in FIGS. 19A and 19B, a resist pattern 5 is formed at a predetermined region on conductive layer 3a. For miniaturization, resist pattern 5 has a central portion narrower than that of resist pattern 15 shown in FIGS. 16A and 16B. Thus, resist pattern 5 shown in FIGS. 19A and 19B has a small and uniform width. Etching is effected on conductive layer 3a masked with resist pattern 5, and then resist pattern 5 is removed, so that upper interconnection layer 3 having a small uniform width shown in FIGS. 20A and 20B is formed.

Figure 21A:
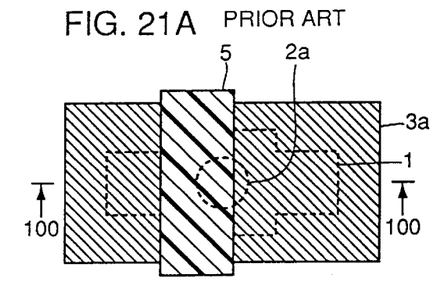
FIGS. 21A and 22A are plans showing layouts and particularly showing a problem of the second manufacturing process in the prior art.
Figure 21B:
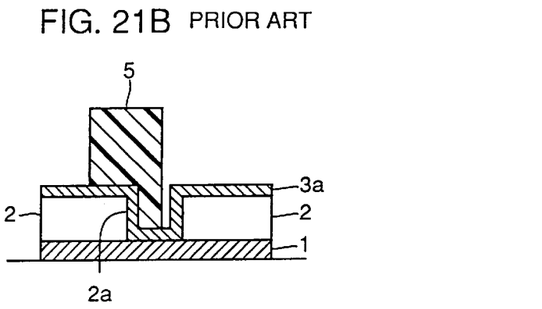
FIGS. 21B and 22B are cross sections taken along line 100—100 in FIGS. 21A and 22A, respectively.
Figure 22A:
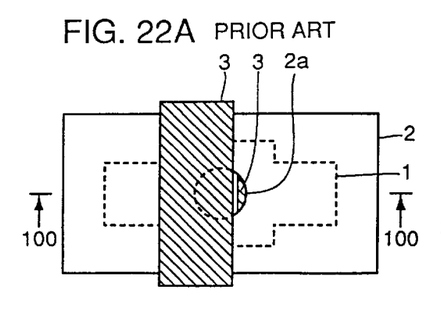
Figure 22B:
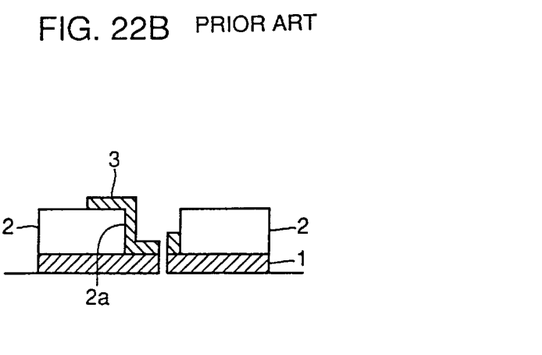

The conventional second manufacturing process allowing miniaturization shown in FIGS. 19A, 19B, 20A and 20B suffers from the following problem. Referring to FIGS. 21A, 21B, 22A and 22B, the problem will be described below. As shown in FIGS. 21A and 21B, when resist pattern 5 was located at a shifted position during exposure, it is difficult to fill completely contact hole 2a because resist pattern 5 has a small width. More specifically, as shown in FIG. 21B, resist pattern 5 does not completely fill the concavity which is defined by conductive layer 3a located in opening 2a. If etching were effected on conductive layer 3a masked with resist pattern 5 thus formed, upper interconnection layer 3 and lower interconnection layer 1 would be partially etched as shown in FIG. 22B, and breakage of the interconnections would occur in the worst case. Therefore, it has been difficult to use the manufacturing method shown in FIGS. 19A, 19B, 20A and 20B, and one must use the manufacturing process shown in FIGS. 12A and 12B through FIGS. 17A and 17B which is not suitable to miniaturization. As a result, it is difficult to provide a manufacturing process suitable to miniaturization of elements in the prior art.

SUMMARY OF THE INVENTION

An object of the invention is provide a method of manufacturing a semiconductor device suitable to miniaturization of elements.

Another object of the invention is to provide a method of manufacturing a semiconductor device allowing reduction in an overlapping margin.

According to an aspect of the invention, a method of manufacturing a semiconductor device includes the following steps. First, a lower interconnection layer is formed. After forming an interlayer insulating film on the lower interconnection layer, an opening reaching the lower interconnection layer is formed at the interlayer insulating film. Processing is performed to form a conductive layer located along the side surface of the opening, being in contact with the lower interconnection layer and extending along the upper surface of the interlayer insulating film. Processing is performed to form an organic polymer film filling a concavity formed by the conductive layer located at least in the opening. A resist pattern is formed on the organic polymer film. An upper interconnection layer is formed by etching the organic polymer film and the conductive layer masked with the resist pattern. According to the manufacturing method of the first aspect, as described above, the organic polymer film filling the concavity formed by the conductive layer is formed after forming the conductive layer in contact with the lower interconnection layer, and then the resist pattern is formed on the organic polymer film. Therefore, even if the resist pattern is shifted from an intended position, the organic polymer film formed in the opening functions as an etching stopper during the processing of etching the organic polymer film and the conductive layer masked with the resist pattern. Thereby, etching of the conductive layer located in the opening can be effectively prevented even when the resist pattern is shifted. As a result, it is possible to prevent disadvantageous etching of the lower interconnection layer, which may be caused by etching of the conductive layer located in the opening. According to the manufacturing method of the first aspect, as described above, it is possible to prevent disadvantages such as etching of the lower interconnection layer even when the resist pattern is in the shifted position, and therefore it is possible to use a finer photoresist pattern than the prior art. As a result, the overlapping margin can be reduced, and therefore it is possible to provide the manufacturing method suitable to miniaturization. The etching may be performed such that the organic polymer film and the conductive layer located at least on the portion of the interlayer insulating film other than the portion located in the opening are removed. The etching may be performed under the conditions that an etching rate of the conductive layer is equal to or smaller than an etching rate of the organic polymer film. The organic polymer film preferably contain one of polyimide polymer, polysulfonic acid polymer, polymelamine polymer and polymethacrylic acid polymer. In this case, the organic polymer film may contain crosslinking polymer, and the method may further include the step of hardening the organic polymer film by thermally processing the organic polymer film prior to formation of the resist pattern. The organic polymer film may contain a material insoluble in solvent of the resist pattern. This can simplify the manufacturing process, because thermal processing of the organic polymer film is not necessary. The organic polymer film is preferably formed by a rotary application method. The conductive layer preferably has a film thickness equal to or smaller than ½ of the diameter of the opening. The organic polymer film may include an anti-reflection film for the exposure. This can improve the accuracy of size of the resist pattern, so that the overlapping margin can be further reduced. The anti-reflection film is prepared by adding pigment having an absorbency with respect to a wavelength of exposure light used for forming the resist pattern into the organic polymer film.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A through 11A are plans showing layouts and particularly showing a first manufacturing process of a semiconductor device of an embodiment 1 of the invention, and FIGS. 1B through 11B are cross sections taken along line 100—100 in FIGS. 1A through 11A, respectively;

FIGS. 12A through 18A are plans showing layouts and particularly showing a first manufacturing process of a semiconductor device in the prior art, and FIGS. 12B through 18B are cross sections taken along line 100—100 in FIGS. 12A through 18A, respectively;

DESCRIPTION OF THE PREFERRED EMBODIMENTS

Embodiments of the invention will now be described below with reference to the drawings.

(Embodiment 1)

Referring to FIGS. 1A and 1B through 8A and 8B, a method of manufacturing a semiconductor device according to an embodiment of the invention will be described below.

Figure 1A:
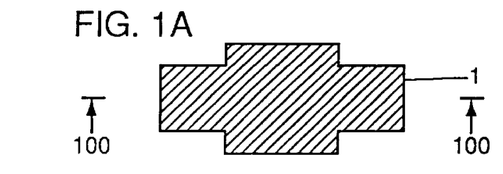
Figure 1B:
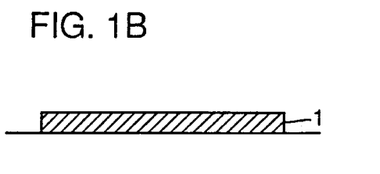

Referring first to FIGS. 1A and 1B, the sputtering method or the like is performed to form lower interconnection layer 1 made of a tungsten silicide film.

Figure 2A:
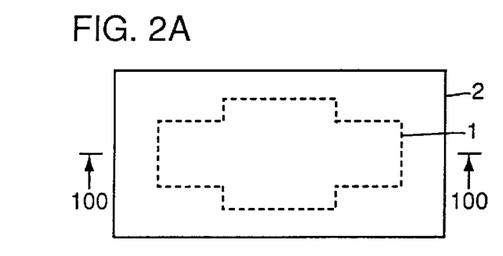
Figure 2B:
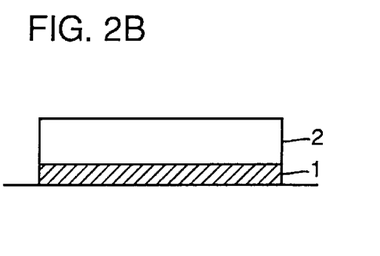
Figure 3A:
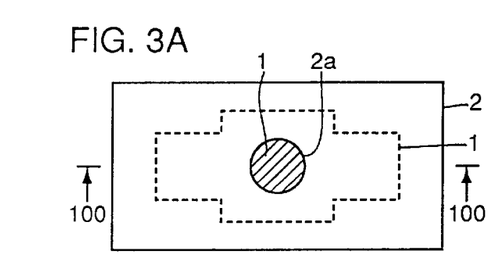
Figure 3B:
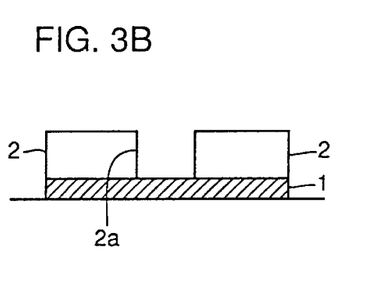

As shown in FIGS. 2A and 2B, interlayer insulating film 2 having a thickness of about 500 nm and made of a silicon oxide film is formed on lower interconnection layer 1 by the CVD method Then, as shown in FIGS. 3A and 3B, hole pattern (opening) 2a is formed at interlayer insulating film 2 for electrically connecting lower interconnection layer 1 to an upper interconnection layer which will be described later. Opening 2a has a diameter of about 0.3 $\mu$m (300 nm).

Figure 4A:
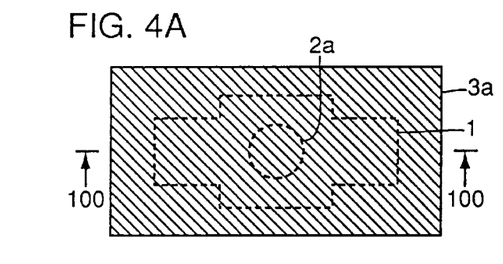

As shown in FIGS. 4A and 4B, conductive layer 3a having a thickness of about 50 nm and made of a tungsten silicide film is formed, e.g., by the sputtering method. Conductive layer 3a may be formed of a polycrystalline silicon film or a layered film made of a polycrystalline silicon film and a tungsten silicide film. Since opening 2a has a diameter of 300 nm, conductive layer 3a which has a thickness of about 50 nm and is formed in opening 2a cannot fully fill opening 2a as shown in FIG. 4B. Therefore, conductive layer 3a located in opening 2a have a concave form.

Figure 5B:
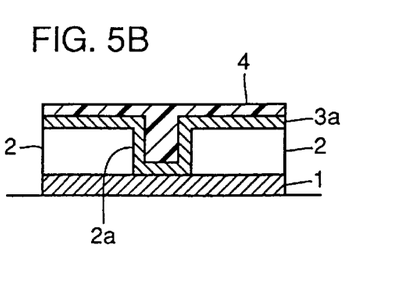

Then, as shown in FIGS. 5A and 5B, organic polymer film 4 of about 80 nm in thickness is formed on a flat portion by a spin coating method (i.e., rotary application method). Since organic polymer film 4 has a good property to fill a hole, its thickness of about 80 nm is large enough to fill the concavity of conductive layer 3a located in contact hole 2a.

Organic polymer film 4 may be made of polyimide polymer, polysulfonic acid polymer, polymelamine polymer or polymethacrylic acid polymer. If the organic polymer film is made of crosslinking polymer such as polymelamine polymer or polyimide polymer, organic polymer film 4 thus formed is then thermally processed at a temperature of 130° C. or more by a hot plate, so that the organic polymer film 4 is hardened by a heat. This prevents solution of organic polymer film 4 into acetate solvent, which will be used for a resist pattern to be formed later. This heat treatment is not necessary if the organic polymer film is made of the polysulfonic acid polymer or the like which is insoluble in the acetate solvent. This simplifies the manufacturing process. The acetate solvent for the resist may be propylene glycol methyl ether acetate, ethyl cellosolve acetate or methyl 3-methoxypropionate.

Figure 6A:
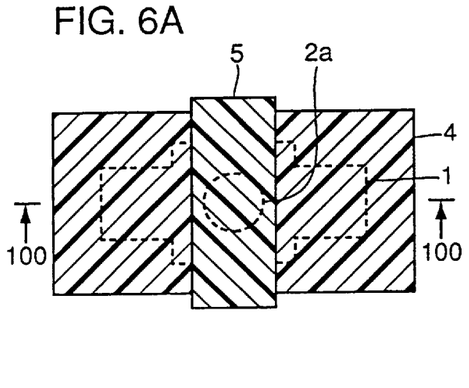
Figure 6B:
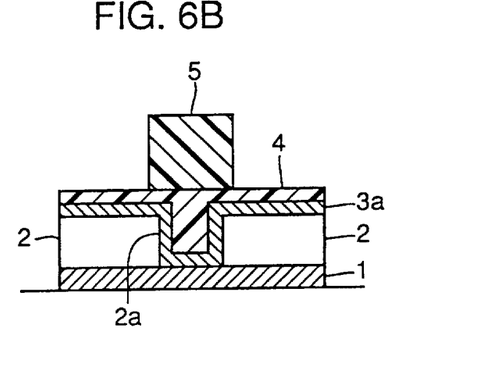
Figure 7A:
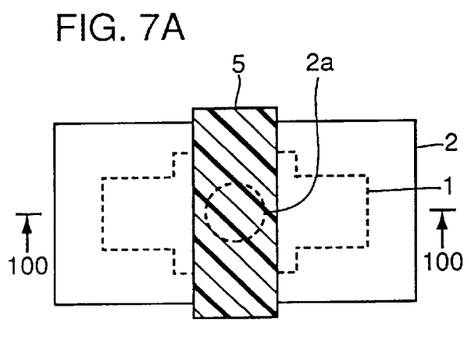
Figure 7B:
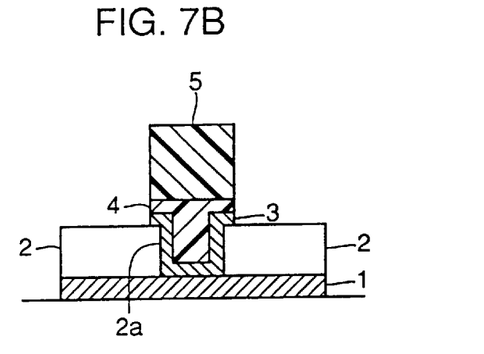

After the step shown in FIGS. 5A and 5B, resist pattern 5 is formed at a region on organic polymer film 4 located above opening 2a, as shown in FIGS. 6A and 6B. Resist pattern 5 has a uniform width which is smaller than that of resist pattern 15 in the prior art shown in FIGS. 16A and 16B. Etching is effected on organic polymer film 4 and conductive layer 3a thus formed and masked with resist pattern 5, so that upper interconnection layer 3 which is patterned as shown in FIGS. 7A and 7B is formed.

Figure 8A:
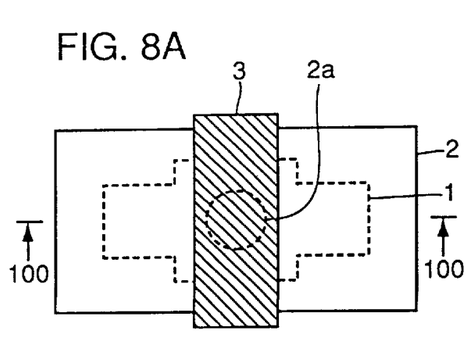
Figure 8B:
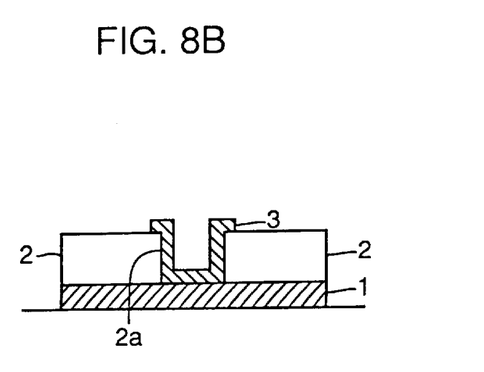

Then, resist pattern 5 and organic polymer film 4 are removed, so that the structure shown in FIG. 8 is completed.

Figure 9A:
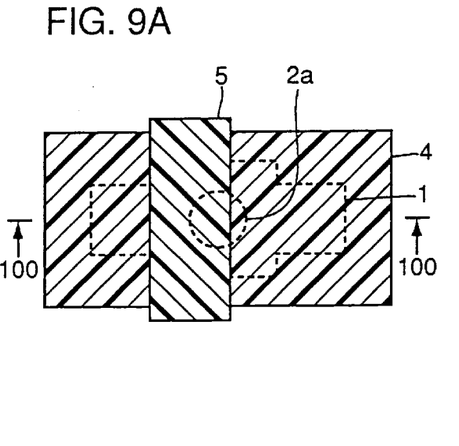
Figure 9B:
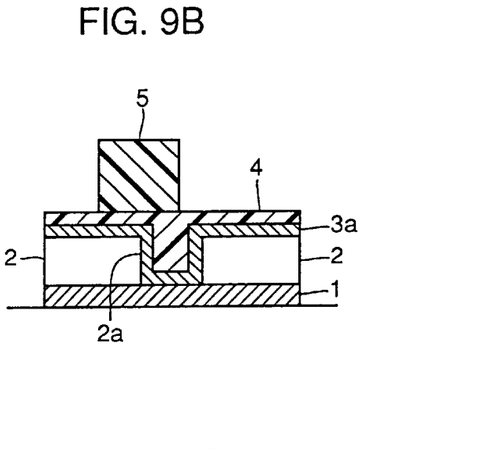

An effect which can be achieved by the manufacturing process of the embodiment 1 shown in FIGS. 1A and 1B through 8A and 8B will be described below with reference to FIGS. 9A and 9B through 11A and 11B. It is now assumed that resist pattern 5 is formed at a shifted position as shown in FIGS. 9A and 9B. More specifically, it is assumed that resist pattern 5 does not completely cover opening 2a, but covers only a part of opening 2a. When etching is effected on organic polymer film 4 and conductive layer 3 masked with resist pattern 5 in the shifted position, organic polymer film 4 located in contact hole 2a functions as an etching stopper and prevents etching of interconnection layer 3 located in contact hole 2a. Thereby, it is possible to prevent effectively a disadvantage caused by the conventional manufacturing process shown in FIGS. 21A, 21B, 22A and 22B, and more specifically such a disadvantage that the bottom of upper interconnection layer 3 located in opening 2a is shaved and lower interconnection layer 1 is also etched. Therefore, an overlapping margin can be smaller than that required in the conventional manufacturing process shown in FIGS. 12A and 12B through 17A and 17B, and therefore the width of resist pattern 5 can be reduced. As a result, it is possible to provide the manufacturing process suitable to miniaturization.

If organic polymer film 4 does not fill opening 2a, conductive layer 3a located in opening 2a is immediately etched. Usually, overetching, i.e., etching to an extent exceeding the film thickness of conductive layer 3 is performed for coping with a variation in film thickness of conductive layer 3a. Therefore, lower interconnection layer 1 is also etched. In contrast to this, according to the embodiment shown in FIGS. 9A and 9B in which organic polymer film 4 fills opening 2a and the etching is effected on organic polymer film 4 and conductive layer 3a masked with resist pattern 5, a portion not located above opening 2a is etched to expose the surface of interlayer insulating film 2, and etching of the portion of organic polymer film 4 which fills opening 2a is completed before the surface of lower interconnection layer 1 is exposed. In this manner, the etching of lower interconnection layer 1 is effectively prevented. The etching in this manner is performed with an etching gas made of chlorine and, in some cases, 5% or less of oxygen added thereto. A degree of vacuum in the chamber is controlled to be 0.1 to 0.5 Pa or less. An etching selection ratio between organic polymer film 4 and interconnection layer 3a (i.e., a ratio of an etching rate of conductive layer 3 to an etching rate of organic polymer film 4) is set to 1.0 or less. Owing to the etching conditions thus controlled, the etching can be effected on organic polymer film 4 and conductive layer 3a such that the portion not located above opening 2a is etched to expose the surface of interlayer insulating film 2 and the etching of the portion of organic polymer film 4 filling opening 2a is completed before the surface of lower interconnection layer 1 is exposed.

Figure 10A:
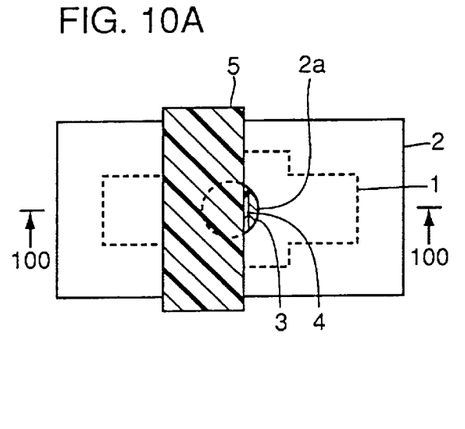
Figure 10B:
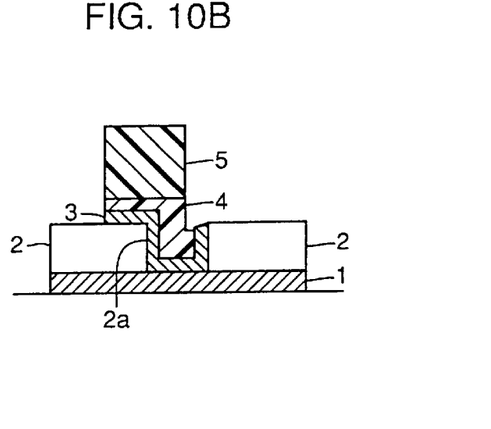
Figure 11A:
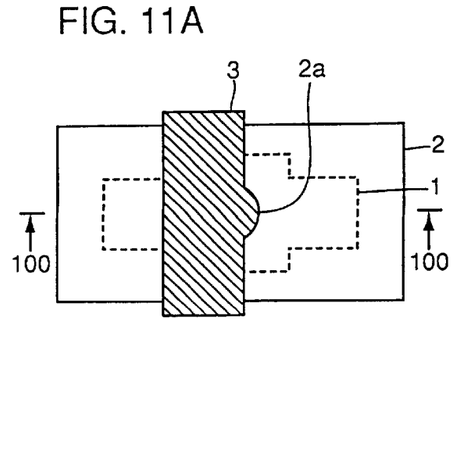
Figure 11B:
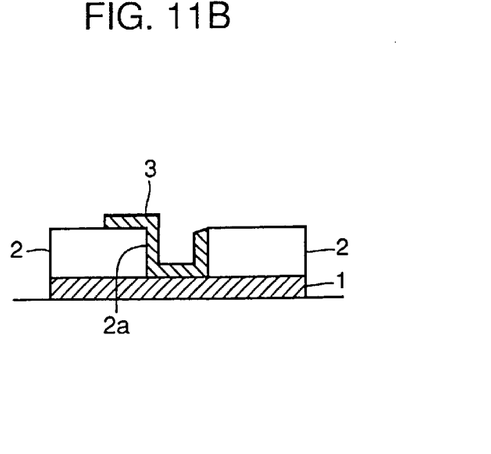

After the step shown in FIGS. 10A and 10B, resist pattern 5 and organic polymer film 4 are removed, so that upper interconnection layer 3 can be formed as shown in FIGS. 11A and 11B.

(Embodiment 2)

In contrast to the embodiment 1 described above, organic polymer film 4 in the embodiment 2 is additionally provided with an anti-reflection function for photolithography. This can improve the accuracy of size of resist pattern 5, and the manufacturing process can be more suitable to miniaturization than the manufacturing process of the embodiment 1. Organic polymer film 4 having the anti-reflection function can be prepared by adding pigment into the solvent of organic polymer film 4, and more specifically, adding thereto the pigment such as azo compound, benzophenol derivative, naphthalene derivative or anthracene derivative, which has an absorbancy with respect to a wavelength of exposure light used for forming resist pattern 5.

Although the present invention has been described and illustrated in detail, it is clearly understood that the same is by way of illustration and example only and is not to be taken by way of limitation, the spirit and scope of the present invention being limited only by the terms of the appended claims. For example, lower interconnection layer 1 may not be formed of a general conductive layer, but may be formed of an impurity region such as a semiconductor substrate.

What is claimed is:

1. A method of manufacturing a semiconductor device having a multilayer interconnection structure, comprising the steps of:

forming a lower interconnection layer;

forming an interlayer insulating film on said lower interconnection layer, and then forming an opening reaching said lower interconnection layer at said interlayer insulating film;

forming a conductive layer located along a side surface of said opening, being in contact with said lower interconnection layer and extending along an upper surface of said interlayer insulating film;

forming an organic polymer film filling a concavity formed by said conductive layer located at least in said opening;

forming a resist pattern on said organic polymer film; and forming an upper interconnection layer by etching said organic polymer film and said conductive layer using said resist pattern as mask.

2. The method of manufacturing the semiconductor device according to claim 1, wherein said etching is performed such that said organic polymer film and said conductive layer located at least on the portion of said interlayer insulating film other than the portion located in said opening are removed.

3. The method of manufacturing the semiconductor device according to claim 1, wherein said etching is performed under the conditions that an etching rate of said conductive layer is equal to or smaller than an etching rate of said organic polymer film.

4. The method of manufacturing the semiconductor device according to claim 1, wherein said organic polymer film contains one of polyimide polymer, polysulfonic acid polymer, polymelamine polymer and polymethacrylic acid polymer.

5. The method of manufacturing the semiconductor device according to claim 4, wherein said organic polymer film contains crosslinking polymer, and said method further comprises the step of hardening said organic polymer film by thermally processing said organic polymer film prior to formation of said resist pattern.

6. The method of manufacturing the semiconductor device according to claim 4, wherein said organic polymer contains a material insoluble in solvent of said resist pattern.

7. The method of manufacturing the semiconductor device according to claim 1, wherein said organic polymer film is formed by a rotary application method.

8. The method of manufacturing the semiconductor device according to claim 1, wherein said conductive layer has a film thickness equal to or smaller than ½ of the diameter of said opening.

9. The method of manufacturing the semiconductor device according to claim 1, wherein said organic polymer film includes an anti-reflection film for the exposure.

10. The method of manufacturing the semiconductor device according to claim 9, wherein said anti-reflection film is prepared by adding pigment having an absorbency with respect to a wavelength of exposure light used for forming said resist pattern into said organic polymer film.

* * * * *